Sept. 22, 1959 | E. R. BOWERMAN | 2,905,539

METHOD FOR THE PRODUCTION OF CONDUCTIVE PATTERNS AND RESULTANT PRODUCT

Filed Sept. 9, 1955 | 2 Sheets-Sheet 1

INVENTOR.
EDWIN R. BOWERMAN
BY Morton Amster
ATTORNEY

Sept. 22, 1959 E. R. BOWERMAN 2,905,539

METHOD FOR THE PRODUCTION OF CONDUCTIVE PATTERNS AND RESULTANT PRODUCT

Filed Sept. 9, 1955 2 Sheets-Sheet 2

INVENTOR.
EDWIN R. BOWERMAN
BY Morton Amster
ATTORNEY

1

2,905,539

METHOD FOR THE PRODUCTION OF CONDUCTIVE PATTERNS AND RESULTANT PRODUCT

Edwin R. Bowerman, Whitestone, N.Y., assignor, by mesne assignments, to Sylvania Electric Products Inc., Wilmington, Del., a corporation of Delaware Application September 9, 1955, Serial No. 533,275

12 Claims. (Cl. 41—43)

The present invention is concerned with the manufacture of conductive patterns on insulating supports or bases, useful in the production of electrical circuits and parts, and in particular to improved methods and apparatus for the preparation of printed circuits and components, and to such circuits and components as improved articles of manufacture.

Numerous techniques are known for the manufacture of printed wiring and/or circuit components on planar supports which can be conveniently dimensioned, shaped or formed to a particular application or environment. Included among the components which may be manufactured by printed circuit techniques are condenser plates, inductances, contacts, and complete circuits. Known fabricating methods include the embossing of metal foil or metal powder into a plastic insulating support or base, printing appropriate supports with electrically conductive inks, die casting of wires onto parts or connections embedded in a plastic support, depositing metal into grooved surfaces of a support with subsequent mechanical removal of unwanted portions of the deposited metal, preparation of a metal clad support and etching away of unwanted metal from the support, and electroforming onto an appropriately masked cathode and transfer of the electroformed part to an insulating support.

Broadly, it is an object of the present invention to provide an etching method for the preparation of conductive patterns, useful as circuit components and in complete circuits.

In the printing of a resist impression in the configuration of the desired conductive pattern on a metal clad insulating base, it is essential that the printed resist impression adhere to the surface to be protected. When an etching resist is printed by letterpress, intaglio, gravure, silk screen, or photo-binder methods, the resist must have sufficient adhesion to the surface under treatment during etching such that the etching resist will not lift away from the metal. Further, during etching of the metal surfaces, undercutting of the resist-protected surfaces occurs unless additional and periodic applications of resist are made to the sides of the protected surfaces during the etching operation. For example, in the preparation of zinc printing plates, additional resist is applied after each bite to produce an etched design which is not undercut.

The problem of the adhesion of the resist in the desired configuration of the conductive pattern to the underlying base becomes more pronounced when the etchant is agitated. The relative motion between the etchant and the metal is desirable in that is assures more rapid removal and allows for a faster processing time. However, for a process using agitation, it is essential that the resist be very adherent to the underlying base, since any undercutting of the resist incident to the etching operation initiates a lifting or peeling action of the resist. To attain adequate adhesion, it is necessary to slow dry or cure the resist after its application to the insulating support or base. Attempts to force dry the resist to

2 speed up processing time brings about case hardening of the resist; such case hardened resist tends to lift away as a result of the relative motion of the etchant.

In addition to the aforementioned requirements, it is essential that the resist impression or mask be free from holes and/or poorly adherent areas to avoid metal removal from points within the protected or masked regions. It is known that over-printing two or more layers of the resist reduces the probability of undesired metal exposure through holes in the protective resist. A further practice prevalent to avoid such exposure is to print, as by silk screening, a thick resist pattern which remains fluid for a period sufficient to eliminate the holes through the action of surface tension forces. This latter process is desirable in that it eliminates the registration problems attendant to over-printing with two or more layers of resist. However, the use of a thick resist film requires comparatively long drying times to assure adequate adherence during etching, particularly when the etchant is flowed in relation to the parts under treatment.

In order to demonstrate some of the practical considerations involved in production of printed circuit, electrical components or parts and wiring, typical commercially adopted processes will be briefly described. One such process involves the initial blanking and shaping of an insulating base clad with one ounce per square foot copper followed by the application of a resist lacquer to protect the copper surfaces. The resist lacquer is applied in the desired pattern or shape by the use of an appropriate silk screen. The resist is then dried to touch with an air blast under infra-red lamps and then air dried for a period of approximately 12 to 24 hours. The drying time is dependent upon the thickness of the resist and the processing to follow. If the etchant is to be vigorously agitated, longer drying times are required. After drying for a period to assure adequate adhesion, the parts are etched to remove the copper from the unprotected areas, for example by immersion in a 40 percent by weight ferric chloride solution for approximately 15 minutes. Following the chemical removal of the unwanted regions it is necessary to subject the part to a number of rinses. Conventionally, such rinsing involves immersion in an acetic acid solution, an alkaline solution, a detergent solution and finally a water wash. During the several rinsing operations, the resist is removed leaving the desired copper pattern on the insulating support or base, the pattern being in the shape of the silk screened resist. The part is completed by mechanically burnishing or bright dipping the copper end by the application of a protective water dip lacquer coating.

A somewhat more economical process for the preparation of printed circuits and components involves the initial perforation and blanking of a plastic sheet or base, followed by a surface roughening and coating the surface of the sheet with an adhesive. After chemical preparation, such as a stannous chloride spray, a thin conductive film, as of copper or silver, is formed on the coated surface of the sheet or board. Such film is conveniently formed by spray guns of the type used for producing mirrors. The chemically-reduced film produced with the guns is then rinsed, dried and printed with a plating resist lacquer in the negative of the desired conductive pattern. That is, regions of the silver or copper film which are in the shape of the desired pattern are left unexposed. The lacquer is then dried for a period sufficient to assure adequate adhesion and copper is deposited on exposed regions of the thin metal film by conventional plating techniques. Following plating of the unprotected regions to a desired thickness, the resist lacquer, the underlying thin film and the adhesive are removed from the unplated areas, thus leaving the plated copper laminated to the underlying sheet or board in the desired regions. The plated copper surfaces may then be protected by an appropriate water-dip lacquer. Although this process is somewhat more economical, there is still the problem of preparing the resist pattern, the time factor involved in assuring adequate drying, and the necessity for good adhesion of the resist pattern to the part.

Accordingly, it is an object of the present invention to provide methods and apparatus for the preparation of conductive patterns on insulating supports which bring about substantial savings in time and results in material cost economies. Specifically, it is within the contemplation of this invention to provide a positive means for masking desired areas of a metal clad or coated laminate which is to be then exposed to an etchant to bring about metal removal in the unprotected areas.

It is a further object of the present invention to improve the preparation of conductive patterns by chemical attack by bringing about substantial reductions in undercutting of the conductive pattern. In accordance with this aspect of the invention, better definition is assured and the margins of the conductive pattern are integral with the underlying support or surface.

It is a still further object of the present invention to provide improved laminates including a conductive pattern on an insulating base, useful as printed circuits or as parts of electrical circuits, which laminates have excellent edge definition and in which the edges or margins are not structurally weakened due to undercutting.

It is a still further object of the present invention to provide an improved method and apparatus for preparing printed circuits by etching techniques in which the risk of undesired metal exposure through pin holes in the protective masking means is eliminated. In accordance with this aspect, a desired conductive pattern may be prepared which exhibits complete freedom from pin holes and the attendant drawbacks.

In an illustrative embodiment demonstrating aspects of the present method a conductive pattern is formed on a metal-insulator laminate by first applying a deformable raised pattern in the configuration of said conductive pattern against a conductive surface of the insulating base, applying pressure on the deformable raised pattern urging the same against the conductive surface to mask regions in the appearance of an imprint of said conductive pattern, and subjecting the unmasked regions of said conductive surface to chemical attack to etch away the conductive material in the exposed regions. By this process a laminate is obtained including an insulating base and a conductive pattern in the appearance of an imprint of the deformable raised pattern.

By the continued application of pressure to the deformable raised pattern during etching, marginal portions of the deformable raised pattern overhang the margins of the masked region and limit undercutting of the masked region. The small amount of undercutting which occurs during the early stages of chemical attack and prior to the deformation of the pattern into contact with the insulating base wherein the overhang serves as a stop-off against undercutting is eventually eliminated when the overhang comes into direct contact with the underlying portions of the insulating base as a result of the continuous pressure applied to the deformable raised pattern. The small amount of acid trapped during early stages of treatment is soon saturated or exhausted and accordingly does not contribute to continued undercutting.

In accordance with a further aspect of the invention, it is possible to prepare conductive patterns or circuits on opposite conducting surfaces of an insulating base with a high degree of registration between the respective patterns. Registration is achieved simply and directly through provision of integral projections on the respective deformable raised masking members which are contacted against the opposite conductive surfaces of the insulating base; the projections extend into orienting holes through the base, which holes usually serve as circuit connections between the conductive patterns or circuits.

Numerous advantages are realized in the production of conductive patterns according to the present invention. The complete elimination of the use of a resist lacquer or equivalent materials obviously reduces the complexity of processing and eliminates the time loss incident to the required drying of the resist. The problems of avoiding holes and poor adhesion attendant to the use of resists are completely eliminated. The deformable raised pattern may be prepared by techniques well understood in the manufacture of the common rubber stamp, and any prescribed pressure may be applied to the conductive surface to attain a high degree of definition. The margins of the resultant conductive pattern contact the underlying portions of the insulating base, although somewhat undercut during processing, and do not present raised edges which might be a source of trouble during installation or in use. For example, a raised edge may be readily caught by a tool, thus causing the separation of the conductive pattern from the insulating base; further there is the possibility that a worker will cut himself on a raised and relatively sharp undercut margin; still further, uncontrolled variations in electrical properties may well result from undercut margins which are structurally weakened and likely to break off during handling for use. The risk of encountering difficulty with undercut margins is somewhat higher when the insulating base is flexible as is required in many installations where the printed circuit or component is arranged in other than a single plane.

Numerous objects, advantages and features of the invention, as well as the various process, apparatus and article aspects of the invention will be best appreciated by reference to the following detailed description when taken in conjunction with the accompanying drawings, wherein.

Figure 1:
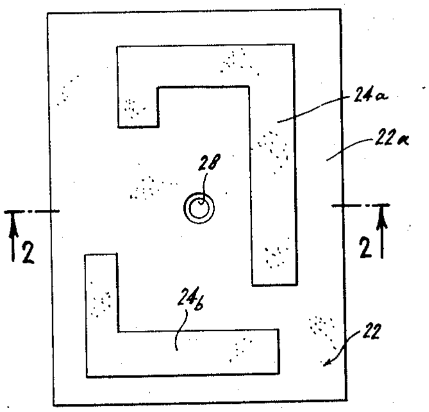
Fig. 1 is a plan view of a typical deformable stamp body or raised pattern constructed according to the present invention.
Figure 2:
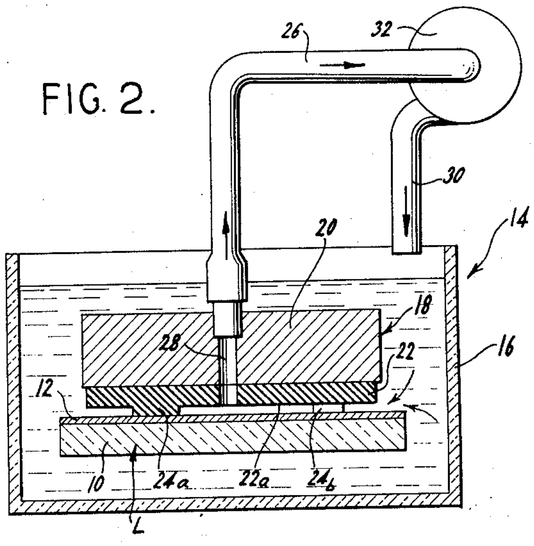
Fig. 2 is a diagrammatic view with parts sectioned along the line 2—2 of Fig. 1 showing typical apparatus for processing laminates according to the present invention.

Referring now specifically to Figs. 1 and 2, there is shown apparatus for the manufacture of a conductive pattern (i.e. a printed circuit) upon a laminate L including an insulating base 10 having an adherent substantially planar conductive layer 12. The apparatus, generally designated by the reference numeral 14 is seen to include a tank 16 containing an etchant capable of chemically attacking the conductive layer 12. Supported within the tank 16 is a combined work holding and masking member 18 including a backing 20 and an elastomer body 22 having raised portions 24 which include one or more elemental parts **24*a*, 24*b* making up a desired pattern to be formed on the conductive layer 12. The term "elastomer" is accorded a meaning consistent with the use of natural, and synthetic rubber and/or equivalent deformable plastics. The work holding and masking member 18 is supported on a length of tube or conduit 26 which is fixed to the backing member 20 and is in communication with a through bore 28 opening into the face 22*a* of the elastomer body 22. The tube of conduit 26 is connected to an appropriate pump 32 (or equivalent structure such as a syphon) which has an outlet pipe 30 directed into the tank 16. The pump 32 serves to circulate the etchant within the tank 16 such that there is a flow or washing of the exposed surfaces of the conductive layer 12 by the etchant; concurrently the pump 32 provides a pressure differential between the member 18 and the laminate L so that the laminate is maintained in assembly with the member 18 with regions of the conductive layer 12 masked by the raised portions 24**.

Following etching the assembly can be transferred to a rinsing tank and the pump discharge 30 diverted from the etching solution to a drain.

Figure 3:
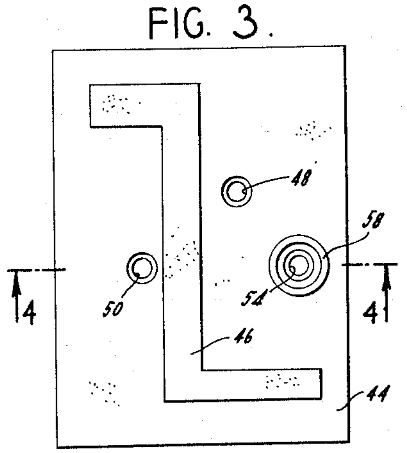
Fig. 3 is a plan view of a modified deformable stamp body demonstrating further features of the present invention.
Figure 4:
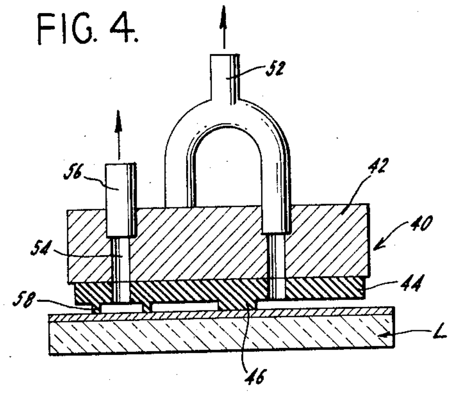
Fig. 4 is a sectional view taken substantially along the line 4—4 of Fig. 3, the stamp body being shown assembled with a laminate for immersion in an etching tank or bath as in Fig. 2.

In some situations it may be to advantage to employ a separate section or vacuum line for continuous handling of the laminate L independent of solution flow. To this end the arrangement illustrated in Figs. 3 and 4 may be employed in which a work holding and masking member 40 is provided which includes a backing 42 and an elastomer body 44 having raised portions 46. As seen in Fig. 3 the raised portions are in a substantially Z-shaped configuration. Outlet or drainage passages 48, 50 are disposed at opposite sides of the raised portion, the passages or bores 48, 50 being connected to a common conduit 52 having branch connections to the respective passages. A separate air or suction passage 54 is provided through the member 40 and has an open end in communication with the face of the elastomer body 44 formed with the raised portions 46. The passage 54 is connected by a suitable conduit 56 to an appropriate vacuum source whereby the laminate L may be held in assembled relation with the member 40 independent of fluid flow through the acid ports or passages 48, 50. A raised annular portion or ring 58 may be formed integrally with the stamp body 44 about the air passage 54 to serve as a suction cup, if the pressure differential alone is insufficient to hold the laminate L assembled with the member 40. However, with the use of such suction cup or cups, it should be that these cups will define regions not making up the main conductive pattern as defined by the raised pattern 46 and which will remain unetched when the assembly is subjected to the action of the etchant. The use of the independent suction holding may be advantageous for automatic production wherein appropriate mechanization may be provided for transfer of the assembly from an etchant tank to one or more washing tanks. An added advantage attributed to the use of a separate suction source is that the masked areas of laminate L will not be exposed to drain back of the etching solution when the pump or syphon 28 is turned off. In either form of the apparatus, there is provided a convenient arrangement for the handling of the laminate L independent of the use of mechanical clamps or like devices to hold the laminate against the combined holder and masking members 18, 40.

Figure 5:
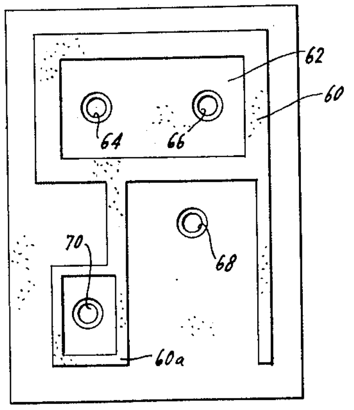
Fig. 5 is a plan view of a still further modified deformable stamp body demonstrating further features of the present invention.

In Fig. 5 there is illustrated a still further masking or stamp body configuration having provision for the circulation or flow of the etchant into enclosed or blocked off regions of a conductive pattern. The stamp body may be of the form illustrated in Figs. 2 and 4 and includes a raised portion 60. The elemental parts of the raised portion 60 are such as to define an enclosed area 62, which area is normally blocked off from exposure to the etchant. For this type of configuration, it is necessary to provide inlet and outlet ports 64, 66 for introducing the etchant into and removing it from the area 62 with etchant circulation within the enclosed area. A pump, or the like can be connected to either inlet or outlet or both. General circulation of the etchant about the raised portion 60 may be achieved by the provision of one or more etchant outlet passages 68 connected to the suction source.

If a comparatively large area is to be masked, it is not necessary that the raised portion correspond to the entire area. For example, the raised portion **60*a* in Fig. 5 is illustrated as being hollowed out in its interior. The outer marginal flange of the raised portion 60*a* will serve to effectively block off or mask a rectangular segment of the conductive layer, despite the fact that the entire area is not masked. If desired, an air outlet passage 70 may be connected to the hollowed-out interior of the raised portion 60*a*** whereby the annular flange or rim defining the masked region serves as a suction cup for maintaining assembly of the work holding and masking member and the laminate L.

A typical process in accordance with the present invention will now be described in detail in order to facilitate a more thorough understanding of the invention:

The deformable stamp body, which may be fabricated integral with the backing member or may be detachable so that several stamp members may be used with a common backing, is prepared in the design of the desired conductive pattern. The stamp body may be fabricated of elastomer materials, such as natural or synthetic rubber, or of resilient synthetics, such as neoprene, Teflon, or polythene. The laminate L used may be any one of the innumerable types useful in the preparation of conductive patterns, including, without limitation, copper and aluminum clad sheets, and solderable zinc-tin alloy plated aluminum base members, as is disclosed in copending application Serial No. 528,844, filed August 16, 1955 in the name of Edward B. Saubestre and Edward P. Bulan and assigned to the assignee of the present invention. The laminate L is assembled with the supporting and masking member, care being taken to obtain proper registry and the required pressure differential to assure holding of the laminate L and pressure contact of the raised portions of the stamp body against the conductive layer or plating. The assembly is then immersed into the etchant, either automatically or manually, which etchant is appropriate to the type of material which is to be removed by chemical attack. Advantageously, a wider range of etchants may be used for metal removal than could be used with resist patterns in that many etchants, although eminently suitable for metal removal are incompatible with resists. By the present teachings it is frequently possible to select an etchant which assures more rapid etching, better recovery of the etchant and/or the metal and less waste disposal problems. For example, for copper-clad laminates L etching for a period of approximately three minutes in an acidified, hot ferric chloride solution is suitable for removal of the unwanted regions of copper. It should be appreciated that the assembly time and etching time is exceptionally short as compared to conventional printing processes employing resists which require a printing and drying time of 12 to 24 hours followed by at least 15 minutes of etching. Aluminum clad laminates plated with solderable zinc-tin alloy as described in said copending application may be etched in a hot hydrochloric acid solution for approximately 15 seconds to attain the desired metal removal. It must be stressed that the selection of the etchant is entirely conventional and depends upon the type of conductive material to be removed and the slowness of attack to the stamp body. The definition obtained for final pattern after etching of course depends upon the type of material used in the stamp body and upon the pressure contact which exists between the stamp body and the work. In this respect, the lateral deformability of the stamp body at a given pressure may have to be taken into account to avoid the effects of layout or spreading of the stamp body.

As a result of microscopic study of the physical relationship between the raised deformable pattern and the laminate during etching, it has been discovered that as the etching proceeds there occurs a slight concave undercutting of the margins of the conductive layer which is shielded or masked by the stamp body. As the etching proceeds and the metal is slightly undercut the pressure of the stamp body against the laminate somewhat deforms the edges or margins of the masked portions of the conductive layer and squeezes out the etchant from underneath said margins. Finally the etching is stopped in a positive manner when the stamp body makes contact with the insulating base or layer. Stated somewhat differently, the concave undercutting creates a cantilever supported margin about the masked regions of the conductive layer over which the margins of the stamp body overhang. The cantilever-supported margins deflect and are deformed into contact with the underlying rigid support concurrent with the overhanging portions of the stamp body coming into contact with the board to provide a positive stop-off about the masked regions. Through this positive mechanical stop, good definition is assured despite variation in thickness of the metal layer under treatment, time of etching, changes in solution flow rates, varying chemical properties of the etchant, and other variables encountered in normal processing.

Figure 6:
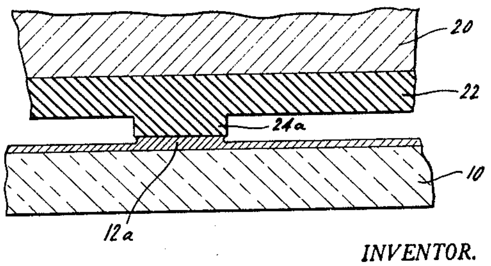
Fig. 6 is an enlarged fragmentary sectional view demonstrating the masking operation of a deformable stamp body during processing in accordance with the present invention.
Figure 7:
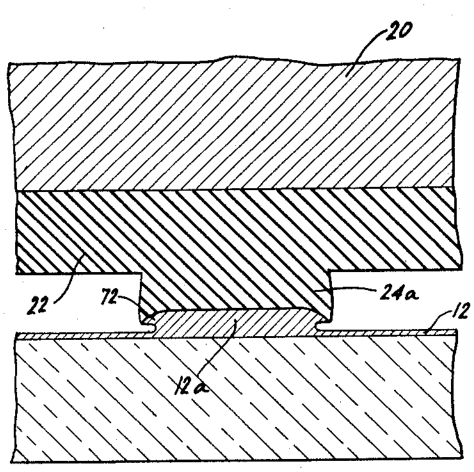
Fig. 7 is a view similar to Fig. 6, on a gerater enlarged scale, showing an intermediate masking condition during processing in accordance with the present invention.
Figure 8:
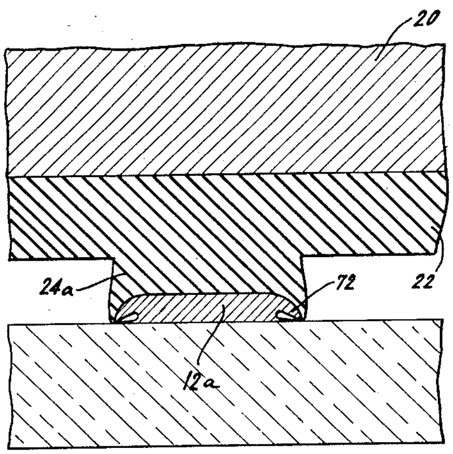
Fig. 8 is a view on a greatly enlarged scale showing in section a laminate prepared according to the present invention and illustrating the forming of the undercut margins into contact with the underlying insulating face or sheet.

The action of the deformable raised pattern under pressure in minimizing undercutting and in assuring the provision of well defined strong and continuous edges for the conductive pattern may be best appreciated by progressively inspecting Figs. 6 to 8 inclusive, which figures are on a greatly enlarged scale. In Fig. 6 there is shown the relative position of the raised portion 24*a* of the stamp body 22 in Fig. 2 in relation to the segment 12*a* of the conductive layer 12 during the etching operation. In Figs. 7 and 8 there is shown on a somewhat enlarged scale, integral portions or edges of the raised pattern part 24*a* overhanging the edges of the conductive pattern part 12*a* (Fig. 7) and finally contacting the underlying insulating support 10 (Fig. 8). The showing of Fig. 8 is for the arrangement of the masking or stamp part 24*a* after the etching operation is completed; actually the overhanging edges of stamp parts 24*a*, 24*b* appear to follow or stay with the portions of the conductive layer being undercut during the chemical attack. The segment 12*a* of the conductive patern after the etching operation is seen best in Fig. 8. As was previously pointed out during the etching operation there is some undercutting of the margins of the part 12*a*. The effect of the pressure exerted by the stamp part or member 24*a* is to deform or turn under the undercut margins as indicated by the reference numeral 72; this avoids the occurrence of undercut raised edges or margins and the problems attendant thereto. By the turning down or bending of the margins, the definition of a pattern is not effected, and in some instances is improved in that the risk of breaking off of edge portions is minimized. Further the avoidance of raised edges substantially reduces the probability of separation of the conducting pattern from the insulating support or base and the risk of a worker coming into contact with a potentially dangerous sharp edge.

Although the showing of Fig. 8 shows appreciable bending over of the marginal edges of the conductive patterns, it should be appreciated that this showing is on a greatly exaggerated scale and magnifies the condition; the actual degree to which undercutting and subsequent bending over of the marginal edges will occur, depends upon many factors, including the viscosity of the etchant used to effect metal removal, the relative velocity between the etchant and the surfaces under treatment, the chemical nature of the etchant, and other factors known to those skilled in art. Experimentation indicates that highly viscous etching materials do not exhibit much edge rounding.

The prior art methods or preparing printing circuits on opposite surfaces of an insulating base and/or effecting the connection between circuit parts through prefabricated holes in the insulating base exhibited many shortcomings. The registration techniques known for ordinary letterpress or silk screen processes are not particularly useful in attempting to effect registration between circuit parts on opposite sides of an opaque support. Practical experience indicates that for good registration it is necessary to drill the supports or laminates from both sides of the insulating base or sheet in order to obtain through holes with adequate registry and to assure subsequent good solderability, that is a fillet of solder all the way around the lead or wire extending through the hole. The illustrative processing apparatus of Fig. 9 makes possible excellent registration, both with respect to previously perforated holes formed in the insulating base and/or to printed circuits to be formed on opposite sides of said base. As will appear from the detailed description to follow, registration is assured despite differential motion of the deformable stamp bodies due to localized temperature differences or strains or other variables which may be encountered in actual processing.

Figures 9, 10:
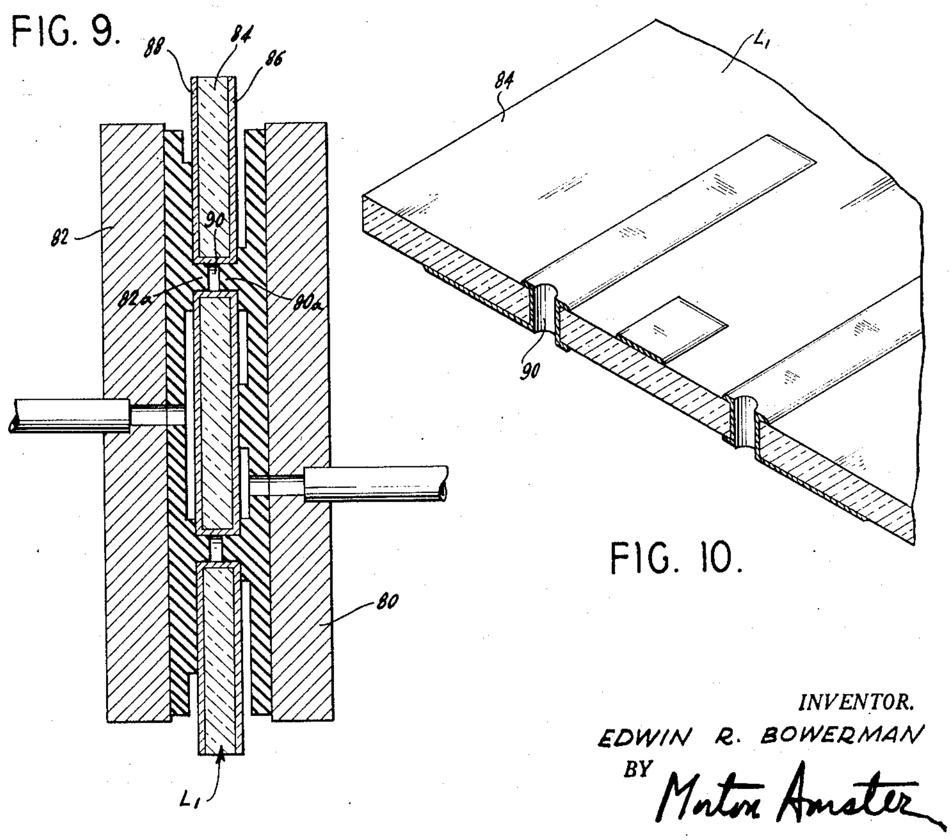
Fig. 9 is a sectional view showing the assembly of two stamp bodies with a laminate illustrating still further process aspects of the present invention.
Fig. 10 is a perspective view of the laminate illustrated in Fig. 9 after processing and sectioned in the place of the section of Fig. 9.

Specifically, in Fig. 9 there is shown the assembly of a pair of stamp bodies or members 80, 82 constructed according to the present invention and to be used in conjunction with a laminate $L_1$ including a base 84 having conductive surfaces 86, 88 on its opposite faces. This type of laminate is used when it is desirable to have selected conductive patterns formed on opposite faces of a common support, as seen in Fig. 10. The stamp bodies or members 80, 82 are assembled in a desired orientation with respect to each other and with respect to the opposite faces of the laminate $L_1$. Orientation may be achieved through the provision of integral aligning plugs or parts 80*a*, 82*a* on the stamp members 80, 82 which plugs are receivable within orienting openings 90 formed in the laminate $L_1$. In the manufacture of a typical printed circuit, the orienting openings 90 may be plated through holes which serve as connections between the circuits formed on opposite faces of the laminate $L_1$.

From the foregoing it will be appreciated that the present invention provides for the preparation of conductive patterns in a comparatively short period of time and by rather simplified techniques, especially as compared to the somewhat conventional method of etching away unwanted portions of a resist-protected metal layer. Further the resultant conductive patterns are structurally improved as compared to the patterns produced by known methods which either result in undercut margins or require some positive means for building up the material along the margins.

Numerous modifications may be made in the foregoing detailed description of the present method and apparatus for practicing the method without departing from the spirit of the invention as set forth in the appended claims. In many instances some features of the invention will be used without a corresponding use of other features.

What I claim is:

1. A method for forming a printed circuit on a laminate having an insulating base and a conductive surface including the steps of applying a deformable raised pattern in the configuration of said printed circuit against said conductive surface, maintaining a continuous pressure on said deformable raised pattern urging the same against said conductive surface, and flowing an etchant against said conductive surface to etch away the conductive material.

2. In the production of a conductive pattern on a surface of an insulator, the steps of covering said surface with a coating of a conductive material, contacting said surface with an elastomer body having a raised portion in the shape of said conductive pattern, urging said raised portion against said surface of said insulator to mask regions coextensive with said conductive pattern, and flowing an etchant over said surface to etch away said conductive material in unmasked regions.

3. A method of producing a conductive pattern on a base which is substantially impervious to chemical attack and formed with a conductive surface comprising the steps of contacting an elastomer stamp having a raised pattern complementary to said conductive pattern against said conductive surface of said base, holding said stamp against said conductive surface by creating a differential pressure between said stamp and said base, and flowing an etchant over the assembly of said stamp and base to etch away the conductive surface in regions unprotected by said raised pattern.

4. A method for forming a conductive pattern on a laminate having an insulating base and a conductive surface including the steps of applying a deformable raised pattern in the configuration of said conductive pattern against said conductive surface, applying pressure on said deformable raised pattern urging the same against said conductive surface to mask regions complementary to said conductive pattern flowing an etchant against said conductive surface to begin to etch away the conductive material, and continuing the application of pressure on said deformable raised pattern to cause marginal portions of said deformable raised pattern to overhang the masked region during etching away of the conductive material whereby the overhang serves to limit undercutting of the masked regions.

5. The method of forming conductive patterns on opposite sides of a laminate having an insulating base and opposed conductive surfaces including the steps of applying deformable stamp members having raised stamp patterns against said conductive surfaces of said laminate, and flowing an etchant against said conductive surfaces to etch away the conductive material in regions unprotected by said stamp members.

6. The method of forming printed circuits on opposite sides of an insulating base having conductive layers on its opposite surfaces including the steps of forming said base with orienting bores, contacting said conductive layers with stamp bodies in the configuration of the printed circuits, bringing said stamp bodies into orientation by extending portions of said stamp bodies into said orienting bores, and subjecting the exposed parts of said conductive layers to attack by an etchant to effect metal removal.

7. The method of forming printed circuits on opposite sides of an insulating base having conductive layers on its opposite surfaces including the steps of contacting said conductive layers with stamp bodies in the configuration of the printed circuits, bringing said stamp bodies into a prescribed orientation and subjecting the exposed parts of said conductive layers to attack by an etchant to effect metal removal.

8. As a new article of manufacture, a laminate including an insulating base, a conductive pattern on said base, said conductive pattern having marginal portions undercut and deformed into contact with said insulating base.

9. In a laminate including an insulating base and a conductive pattern formed on said insulating base by chemical attack of a continuous layer of conductive material adhered to said insulating base, said chemical attack bringing about undercutting of the margins of said conductive pattern, said undercut margins being deformed into contact with underlying portions of said insulating base.

10. A method for forming a conductive pattern on a laminate including an insulating base and a conductive surface comprising the steps of contacting said conductive surface with a deformable mask, urging said mask into contact with said conductive surface whereby a prescribed region in the configuration of said conductive pattern is stopped off by said mask, flowing an etchant against said conductive surface to begin etching away the conductive material which is not stopped off by said mask, the exposure of said conductive surface to said etchant producing undercutting of the margins of said prescribed region, and continuing to urge said mask into contact with said conductive surface during exposure of said conductive surface to said etchant whereby the undercut margins are deformed into contact with said insulating base.

11. A method for forming a conductive pattern on a laminate including an insulating base and a conductive surface comprising the steps of contacting said conductive surface with a deformable mask, urging said mask into contact with said conductive surface whereby a prescribed region in the configuration of said conductive pattern is stopped off by said mask, flowing an etchant against said conductive surface to begin etching away the conductive material which is not stopped off by said mask, the exposure of said conductive surface to said etchant producing undercutting of the margins of said prescribed region, continuing to urge said mask into contact with said conductive surface during exposure of said conductive surface to said etchant whereby the undercut margins are deformed into contact with said insulating base, and continuing to flow said etchant against said conductive surface until the deformed margins are positively stopped off from exposure to said etchant by contact of said mask with said insulating base and until the conductive material which is not stopped off by said mask is etched away.

12. In combination, an insulating base, and a conductive pattern adhered to said base and including undercut marginal portions turned down into contact with said insulating base.

References Cited in the file of this patent

UNITED STATES PATENTS

| | | |
|---|---|---|
| 1,274,206 | Shuman | July 30, 1918 |
| 2,200,314 | Walker | May 14, 1940 |
| 2,288,735 | O'Connell | July 7, 1942 |
| 2,647,852 | Franklin | Aug. 4, 1953 |
| 2,669,048 | Easley et al. | Feb. 16, 1954 |
| 2,739,047 | Sanz | Mar. 20, 1956 |